United States Patent [19]

Otto

[11] 4,110,714
[45] Aug. 29, 1978

[54] SURFACE ACOUSTIC WAVE FILTER

[75] Inventor: Oberdan W. Otto, Los Angeles, Calif.

[73] Assignee: Hughes Aircraft Company, Culver City, Calif.

[21] Appl. No.: 756,929

[22] Filed: Jan. 5, 1977

[51] Int. Cl.$^2$ .................. H03H 9/26; H03H 9/04; H03H 9/30; H03H 9/32

[52] U.S. Cl. .................................. 333/72; 310/313; 333/30 R

[58] Field of Search .............. 333/30 R, 72; 310/313; 340/173.2; 331/107 A; 330/5.5

[56] References Cited

U.S. PATENT DOCUMENTS

| 3,883,831 | 5/1975 | Williamson et al. | 333/30 R |
| 4,048,594 | 9/1977 | Weglein | 333/72 |

*Primary Examiner*—Davis L. Willis
*Assistant Examiner*—Marvin Nussbaum
*Attorney, Agent, or Firm*—John Holtrichter, Jr.; W. H. MacAllister

[57] ABSTRACT

A surface acoustic wave device wherein a reflective array is disposed on a surface of material capable of supporting propagating surface acoustic wave energy, the array including a plurality of spaced, parallel elements having longitudinal axes angularly oriented with respect to the direction of a beam path of propagating straight crested phase fronts, the device also including matching structures disposed adjacent the leading and trailing ends of the elements for converting the normal mode, straight crested phase front outside the reflective array region to the normal mode, sawtoothed shaped, phase front within the reflective array region, and the reverse thereof, and thereby avoid diffractive effects at the entry and exit points of the reflective array.

4 Claims, 3 Drawing Figures

U.S. Patent
Aug. 29, 1978
4,110,714
Fig. 1.
PRIOR ART
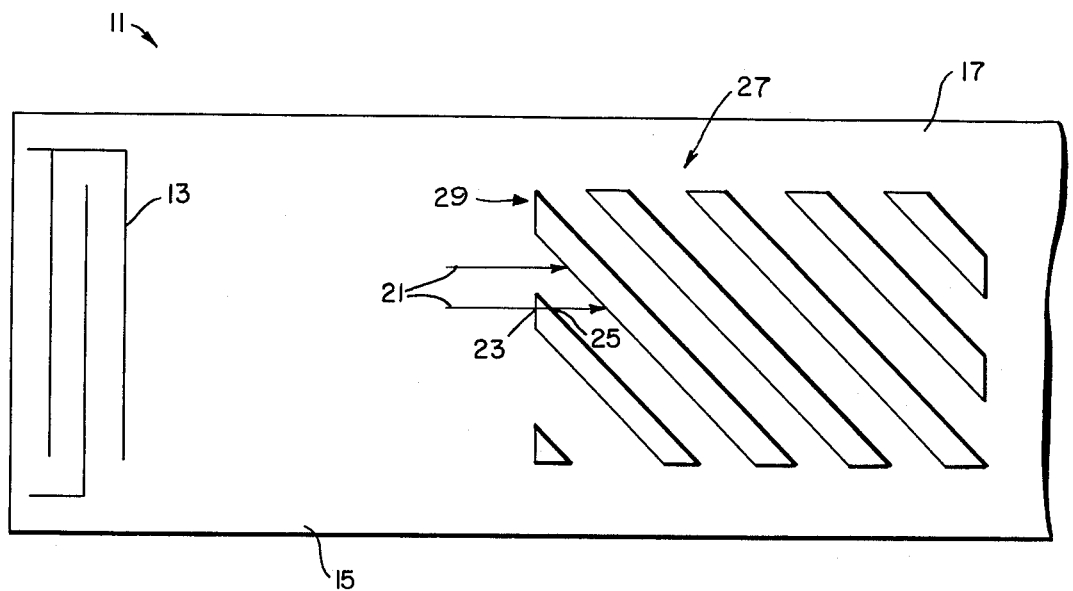
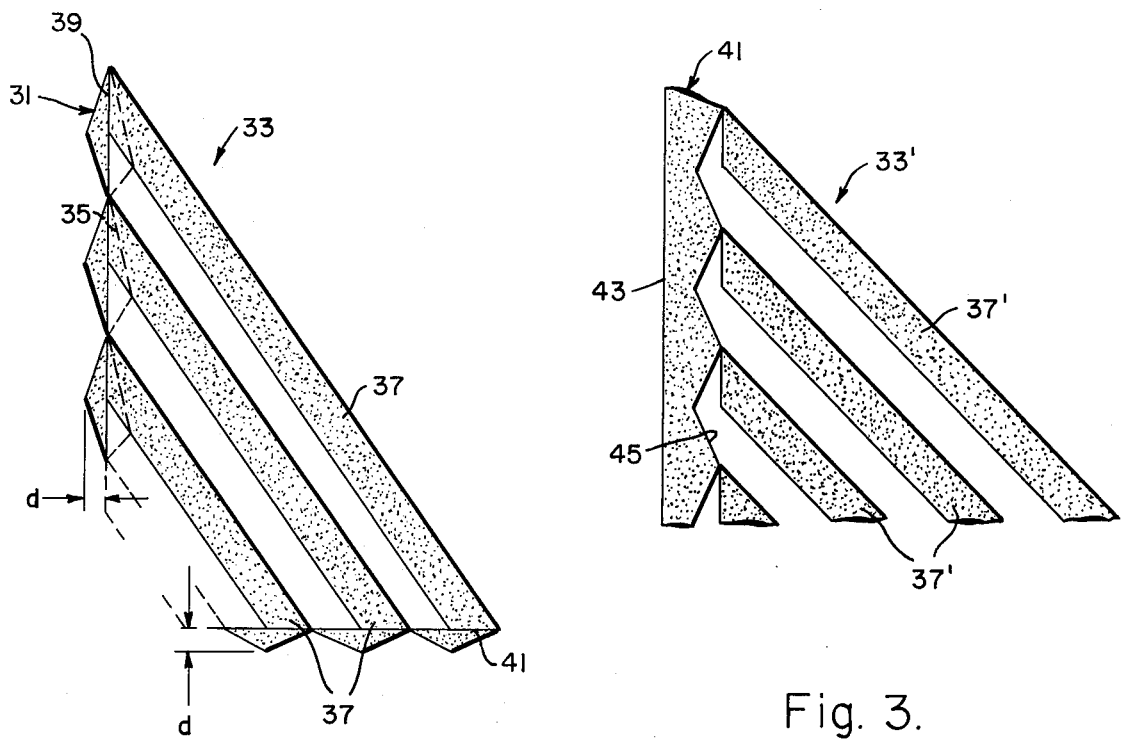
Fig. 2.
Fig. 3.

SURFACE ACOUSTIC WAVE FILTER

BACKGROUND OF THE INVENTION

The background of the invention will be set forth in two parts.

Field of the Invention

This invention relates to surface acoustic wave devices and more particularly to such devices utilizing reflective arrays.

DESCRIPTION OF THE PRIOR ART

One of the basic applications of surface acoustic wave (SAW) devices is in the field of filtering, both bandpass and notch types. Conventional LC circuits function in the VHF region but because of their relatively low Q, have made it desirable to seek more satisfactory solutions to the filtering problem in the VHF and microwave spectrum by the use of SAW techniques.

One such technique is described in an article by R. H. Tancrell and M. G. Holland, entitled "Acoustic Surface Wave Filters" in Proceedings of the IEEE, Vol. 59, page 393, 1971. Another approach is taught in an article in IEEE Transactions, Sonics and Ultrasonics, Vol. SU-15, pages 111–119 (April 1968), entitled "Filters and Dispersive Delay Lines Using Repetitively-Mismatched Ultrsonic Transmission Lines." Still another SAW filter design is found in an article by G. Craven, entitled "Surface-Acoustic-Wave Rejection Filters Using Mode Conversion/Reconversion" in Electronics Letters, Vol. 10, pages 218–219 (May 30, 1974). However, more and more interest is being directed to the use of grating reflector arrays in the beam path of a SAW delay line, as taught, for example, in an article entitled "Bandpass Surface Wave Filters" by J. Melngailes, J. M. Smith and J. H. Cafarella, in IEEE Ultrasonics Symposium Proceedings, Oct. 4–7, 1972, pages 221–223, Cat. No. 72 CHO 708-8 SU.

Although the latter technique holds much promise, it has been found that conventional reflective arrays can cause diffraction of part of the incident wave. The result of this is that the incident wave energy is diffracted into several angularly spaced modes instead of a more desirable single mode. This problem is particularly evident when the change in velocity from the stripes or elements of the reflective arrays to regions between the stripes is relatively large. A discussion of this phenomenon has been published by the inventor in Applied Physics Letters, Vol. 26, No. 5, Mar. 1, 1975, in an article starting on page 215 entitled, "Phase-matching condition for scattering from acoustic surface reflective arrays."

It should, therefore, be evident that a simple technique which would avoid refractive effects at the entry and exit points of surface acoustic wave reflective arrays would constitute a significant advancement in the art.

SUMMARY OF THE INVENTION

In view of the foregoing factors and conditions characteristic of the prior art, it is a primary object of the present invention to provide an improved surface acoustic wave filter.

Another object of the present invention is to provide a simple yet effective and efficient surface acoustic wave filter which incorporates a reflective array that avoids diffraction effects on waves entering or exiting the reflective array.

Still another object of the present invention is to provide a unique surface acoustic wave device wherein the incident wave is reflected by a reflective array into a single mode rather than several angularly spaced modes.

Yet another object of the present invention is to provide a surface acoustic wave reflective filter that avoids undesirable diffraction effects at the entry and exit points of a surface acoustic wave reflective array caused by prism shaped ends of the reflector.

In accordance with one embodiment of the present invention, a surface acoustic wave filter includes a transducer means including an input transducer disposed on a surface of substrate material capable of supporting propagating surface acoustic wave energy for converting electromagnetic energy to surface acoustic wave energy in the substrate with normal mode straight crested phase fronts propagating along a beam path in the surface in a predetermined direction. Also included are reflective means having a surface acoustic wave reflective array disposed on the surface in the phase front beam path and including spaced parallel elements with longitudinal axes angularly oriented with respect to the aforementioned predetermined direction and supporting normal mode sawtooth-shaped phase fronts within the reflective array region. The invention further includes wavefront matching means including matching structures disposed adjacent the leading and trailing ends of the reflective array elements for respectively converting the normal mode phase front shape of the propagating energy outside the reflective array region to the normal mode phase front shape of the propagating energy inside the reflective array region, and the reverse thereof.

The features of the present invention which are believed to be novel are set forth with particularlity in the appended claims. The present invention, both as to its organization and manner of operation, together with further objects and advantages thereof, may best be understood by making reference to the following description taken in conjunction with the accompanying drawings in which like reference characters refer to like elements in the several views.

BRIEF DESCRIPTION OF THE DRAWINGS

FIG. 1 is a schematic plan view of a surface acoustic wave filter utilizing a reflective array of conventional design;

FIG. 2 is a schematic plan view of a surface acoustic wave filter utilizing a reflective array in accordance with the present invention; and FIG. 3 is a schematic plan view of another embodiment of the invention.

DESCRIPTION OF THE PREFERRED EMBODIMENT

Referring now to the drawings, and more particularly to FIG. 1, there is schematically shown a surface acoustic wave filter 11 wherein a conventional input interdigital transducer 13 is plated or deposited on the smooth surface 15 of substrate 17. Incident wave energy, indicated by arrows 21, show that this energy experiences refractive effects at the entry and exit points, 23 and 25, respectively, when such energy encounters a reflective array 27 of conventional design.

A problem is experienced at this point, which may be analyzed as follows. On a uniform surface (no perturbing stripes) any wavefront can be decomposed into plane-wave (straight crested phase fronts) normal modes, some of which may be evanescent. However, in a periodic grating region, the corresponding modes have sawtooth-shaped wavefronts. When a plane wave is incident upon the edge 29 of a periodic region, for example, a mismatch occurs, and the wave diffracts into a number of sawtooth modes determined by application of Bragg's and Snell's laws at the interface between the uniform and periodic regions. This generates a component in the reflective wave which propagates away from the designed direction. In addition, the prism shaped ends at the exit side of the array 27 cause a further mismatch.

The solution provided by the present invention is to precondition the propagating energy prior to its incidence on the leading edge of the periodic grating array by interposing a phase compensating pattern in front of the grating to insure that only one sawtooth mode is generated. This compensating pattern, in the form of sawtooth film 31 in FIG. 2, provides a match between the external region and the grating region defined by grating 33. The design criterion is that the sawtoothed film 31 must convert the straight crested normal mode phase front of the external region to the correct sawtooth-shaped normal mode phase front of the grating region in the immediate vicinity of the interface between the two regions, as indicated by the dotted sawtooth outline 35.

Where the velocity shift in the grating stripe region is the same as for the sawtooth film 31, the sawtooth shape of the film 31 will be the same shape as the outline 35. It will; however, be evident to those skilled in the art, that where the velocity shifts are different, the dimensions of the sawtooth film must be modified accordingly.

The embodiment of the invention illustrated in FIG. 2, provides a technique for matching the incident wavefront to the metalized elements 37 of the array 33, at both the leading edge 39 and at the trailing edge 41. As noted in the previously cited article in Applied Physics Letters, the shape of the normal mode phase front within the grating region is determined by the effective wavevector $Ke$, and the unperturbed and perturbing wavevectors $Kp$ and $Ku$, respectively. The $Kp$ and $Ku$ vectors may be calculated from the value of $Ke$ and the metalization and velocity ratios, which vectors relate directly to the wave shape denoted by the dotted outline 35. In designing the sawtooth shape of the matching film 33, $Ku$ is perpendicular to the wavefront in the gap region between the stripes, and $Kp$ is perpendicular to the wavefront in the stripe region. The depth "$d'$" of the film 31 as compared to the depth "$d$" of the desired sawtooth wavefront within the grating may be derived from the relation:

$$d' = d\,(\Delta V \text{ of the stripe})/(\Delta V \text{ of the film}).$$

The $Ke$ in the grating is generally chosen to be parallel to the $Ki$ (incident) outside the grating).

In this way all of the incident wave energy is transmitted into a single mode rather than several angularly spaced modes. This is particularly important when the change in velocity from the stripes to regions between the stripes is large.

From the foregoing, it should be evident that there has been described a new and improved surface acoustic wave filter that utilizes a relatively simple but important and unobvious design technique for avoiding refractive effects on propagating surface acoustic waves entering or exiting surface acoustic wave reflective arrays.

It should be understood that the materials and fabrication techniques used in implementing the embodiments of the invention are not critical, and any material and technique exhibiting and producing desired characteristics may be substituted for those mentioned.

It should also be realized that although the present invention has been shown and described with reference to a presently preferred embodiment, various changes and modifications obvious to one skilled in the art to which the invention pertains are deemed to be within the spirit, scope and contemplation of the invention, for example, the wavefront matching between the external region and the grating region may be provided by a film 41 shown in FIG. 3. It will be noted here that the incident wavefront edge 43 is straight, while the downstream edge 45 has the same shape and dimensions as that for the upstream edge of the film 31 in FIG. 2.

What is claimed is:

1. A surface acoustic wave filter comprising:
 a substrate of material capable of supporting propagating surface acoustic wave energy;
 transducer means including an input transducer disposed on said surface for converting electromagnetic energy to surface acoustic wave energy in said substrate with normal mode straight crested phase fronts propagating along a beam path in said surface in a predetermined direction;
 reflective means including a surface acoustic wave reflective array disposed on said surface in said path and including spaced parallel elements having longitudinal axes angularly oriented with respect to said predetermined direction, and supporting normal mode, sawtooth-shaped phase fronts within the reflective array region; and
 wavefront matching means including matching structures disposed adjacent the leading and trailing ends of said elements of said reflective array for respectively converting the normal mode phase-front shape of said propagating energy outside said reflective array region to the normal mode phase-front shape of said propagating energy inside said reflective array region, and the reverse thereof.

2. The surface acoustic wave filter according to claim 1, wherein said matching structures includes a sawtooth edge along one of its sides.

3. The surface acoustic wave filter according to claim 2, wherein said sawtooth edge is on the side of said matching structure opposite said reflective array region.

4. The surface acoustic wave filter according to claim 2, wherein said sawtooth edge of said matching structure is immediately adjacent said reflective array region.

* * * * *